(12) United States Patent  
Leone

(10) Patent No.: US 9,408,294 B2  
(45) Date of Patent: Aug. 2, 2016

(54) PRINTED CIRCUIT BOARD ASSEMBLIES PROVIDING FAULT DETECTION

(71) Applicant: General Electric Company, Schenectady, NY (US)

(72) Inventor: Davide Jonathan Leone, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 329 days.

(21) Appl. No.: 14/210,759

(22) Filed: Mar. 14, 2014

(65) Prior Publication Data

US 2015/0263512 A1    Sep. 17, 2015

(51) Int. Cl.
*H02H 5/00*   (2006.01)
*H05K 1/02*   (2006.01)
*H05K 3/00*   (2006.01)
*H05K 3/34*   (2006.01)

(52) U.S. Cl.
CPC ............ *H05K 1/0201* (2013.01); *H05K 1/0262* (2013.01); *H05K 3/0064* (2013.01); *H05K 3/3447* (2013.01); *H05K 2201/0116* (2013.01); *H05K 2201/10151* (2013.01); *H05K 2203/0278* (2013.01); *H05K 2203/1136* (2013.01)

(58) Field of Classification Search
CPC .................................................. H05K 1/0201
USPC ........................................................ 361/103
See application file for complete search history.

(56) References Cited

U.S. PATENT DOCUMENTS

| 4,345,119 | A | * | 8/1982 | Latasiewicz | ......... | H01H 13/702 |
| | | | | | | 200/306 |
| 5,313,015 | A | * | 5/1994 | Hoge | ................. | H01R 23/6873 |
| | | | | | | 174/250 |
| 5,818,101 | A | * | 10/1998 | Schuster | ................... | H01T 4/08 |
| | | | | | | 257/659 |
| 8,228,649 | B2 | | 7/2012 | Shea et al. | | |
| 8,427,380 | B2 | * | 4/2013 | Farrell | ................... | B64D 43/00 |
| | | | | | | 346/700 MS |

FOREIGN PATENT DOCUMENTS

JP       2003078253       3/2003

* cited by examiner

*Primary Examiner* — Stephen W Jackson  
(74) *Attorney, Agent, or Firm* — Dority & Manning, P.A.

(57) ABSTRACT

Printed circuit board assemblies providing fault detection are provided. One example printed circuit board assembly includes a substrate layer. One or more solder pins are located on a rear surface of the substrate layer. The printed circuit board assembly includes a non-conductive layer adjacent to the rear surface of the substrate layer. The printed circuit board assembly includes a conductive layer adjacent to the non-conductive layer. The conductive layer is electrically connected to a ground. The printed circuit board assembly includes a mounting surface. The printed circuit board assembly includes a support layer compressed between the conductive layer and the mounting surface. The support layer applies a mechanical force that presses the conductive layer towards the non-conductive layer.

20 Claims, 5 Drawing Sheets

PRINTED CIRCUIT BOARD ASSEMBLIES PROVIDING FAULT DETECTION

FIELD OF THE INVENTION

The present disclosure relates generally to printed circuit board assemblies. More particularly, the present disclosure relates to printed circuit board assemblies providing fault detection.

BACKGROUND OF THE INVENTION

Printed circuit boards are commonly found in many electronic devices, including, for example, the internal circuitry for controlling and operating an appliance. Printed circuit boards can mechanically support and electrically connect electronic components. For example, printed circuit boards can include vias through which pins the electronic components are inserted. The pins can then be soldered to the rear surface of the printed circuit board to secure the electronic components in place.

Printed circuit boards and their associated components and circuitry can be susceptible to damage or fire due to localized overheating. For example, fault conditions such as high resistance connections, component failures, arc tracking, ground faults, or other fault conditions can result in localized overheating that can cause operational damage to the device or can generate a fire. In particular, if the fire spreads to other portions of the device, then flames may spread beyond the product as well.

One attempted solution to the problems discussed above is to enclose the printed circuit board within an enclosure that prevents the spread of fire. However, this solution requires additional structural components and undesirably complicates the design and positioning of components within the device. Furthermore, use of an enclosure does not prevent significant damage to the components within the enclosure. Therefore, use of an enclosure is generally directed only towards prevention of catastrophic fires, and does not intervene to minimize damage to the overheating components themselves.

Another attempted solution to the problems discussed above is the use of a thermal cut-off device which includes sensors to detect elevated temperatures in the area of the printed circuit board. However, the inclusion of temperature sensors and associated processing circuitry undesirably increases the cost and complexity of a device that may include many printed circuit boards.

Therefore, printed circuit board assemblies providing fault detection are desirable. In particular, printed circuit board assemblies that provide fault detection in a simple, low-cost, and localized fashion are desirable.

BRIEF DESCRIPTION OF THE INVENTION

Additional aspects and advantages of the invention will be set forth in part in the following description, or may be apparent from the description, or may be learned through practice of the invention.

One aspect of the present disclosure is directed to a printed circuit board assembly. The printed circuit board assembly includes a substrate layer. One or more solder pins are located on a rear surface of the substrate layer. The printed circuit board assembly includes a non-conductive layer adjacent to the rear surface of the substrate layer. The printed circuit board assembly includes a conductive layer adjacent to the non-conductive layer. The conductive layer is electrically connected to a ground. The printed circuit board assembly includes a mounting surface. The printed circuit board assembly includes a support layer compressed between the conductive layer and the mounting surface. The support layer applies a mechanical force that presses the conductive layer towards the non-conductive layer.

Another aspect of the present disclosure is directed to a printed circuit board assembly. The printed circuit board assembly includes a substrate layer supporting one or more components on a first surface and having one or more solder pins on a second surface. The one or more solder pins are associated with the one or more components. The printed circuit board assembly includes a non-conductive layer adjacent to the second surface of the substrate layer. The printed circuit board assembly includes a conductive layer adjacent to the non-conductive layer and connected to a ground. The printed circuit board assembly includes a foam layer adjacent to the conductive layer. The printed circuit board assembly includes a mounting surface. The foam layer is compressed between the mounting surface and the conductive layer so as to apply pressure to the conductive layer that influences the conductive layer towards the second surface of the substrate layer. The non-conductive layer decomposes at elevated temperatures associated with a high resistance connection, a failure of the one or more components, or an arc tracking event. Decomposition of the non-conductive layer allows electrical connection between the one or more solder pins and the conductive layer, thereby grounding the one or more components.

Another aspect of the present disclosure is directed to a printed circuit board. The printed circuit board includes a substrate. The substrate has one or more conductive components embedded therein. The printed circuit board includes a non-conductive layer adjacent to the conductive components embedded in the substrate. The printed circuit board includes a conductive layer adjacent to the non-conductive layer. At least a portion of the conductive layer is conductive of electrical energy. The printed circuit board includes a foam support layer adjacent to the conductive layer. The foam support layer is compressed so as to provide pressure forcing the conductive layer towards the non-conductive layer. At least a portion of the non-conductive layer is formed from a material that decomposes at temperatures associated with a fault condition.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Figure 1:
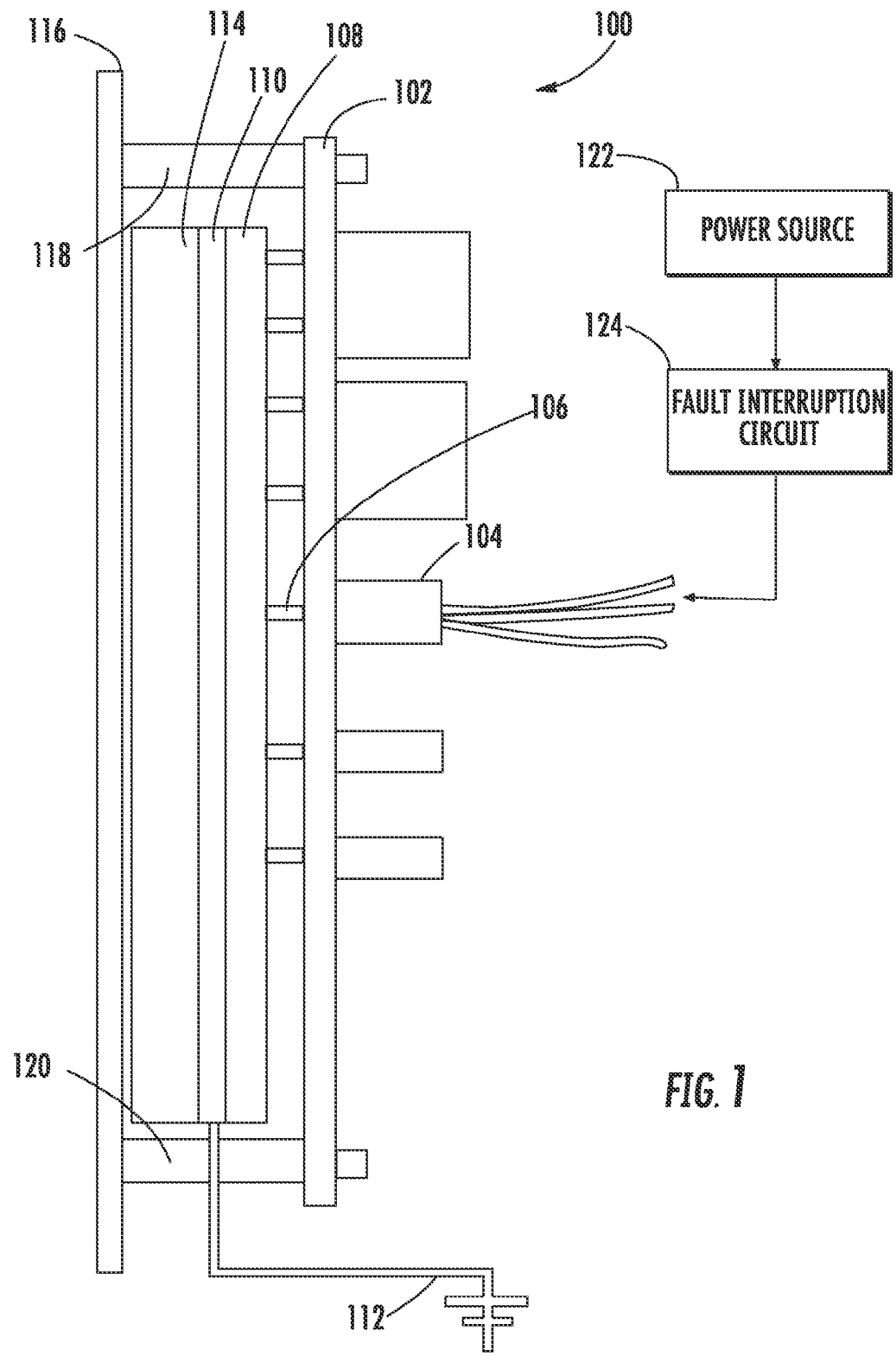
FIG. 1 depicts a simplified diagram of an example printed circuit board assembly according to an example embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

With reference now to the FIGS., example embodiments of the present disclosure will be discussed in further detail. FIG. 1 depicts a simplified diagram of an example printed circuit board assembly 100 according to an example embodiment of the present disclosure. For example, printed circuit board assembly 100 can be included in an appliance, such as, for example, a dishwasher.

Printed circuit board assembly 100 can include a substrate layer 102. The substrate layer 102 can be non-conductive and can have conductive strips printed upon it or embedded within it. For example, the substrate layer can be made from Teflon, ceramics, polymers, fiberglass, fiberglass epoxy laminates, or other suitable materials.

One or more electronic components (e.g. resistors, transistors, ASICs, processing chips, etc.) can be mounted onto a front surface of substrate layer 102. For example, electronic component 104 is mounted upon substrate layer 102.

In particular, a pin of component 104 can be inserted through a via formed into substrate layer 102. The pin can be soldered with respect to substrate layer 102 to secure component 104 in place. Thus, a solder pin 106 can extend a small distance from the rear surface of substrate layer 102.

It will be appreciated that the term "solder pin" is used herein in a generalized fashion to refer to electrically conductive elements that are associated with the mounted components. For example, solder pin 106 of component 104 can be any conductive element associated with component 104 and does not necessarily include a pin of component 104.

Printed circuit board assembly 100 can include a non-conductive layer 108 adjacent to the substrate layer 102. As an example, non-conductive layer 108 can be formed from a dielectric material. For example, non-conductive layer 108 can be a plastic sheet.

In some embodiments, the non-conductive layer can be formed from a material that increases in conductivity when heated to temperatures associated with fault conditions at one or more adjacent components. For example, the non-conductive layer can increase in conductivity by becoming carbonized.

Printed circuit board assembly 100 can further include a conductive layer 110 adjacent to the non-conductive layer 108. Conductive layer 110 can be connected to a ground 112.

As an example, the conductive layer 110 can be a sheet of metallic foil. As another example, the conductive layer 110 can include conductive traces at locations that parallel the locations of particular solder pins.

Printed circuit board assembly can also include a support layer 114. In particular, the support layer 114 can be compressed between the conductive layer 110 and a mounting surface 116.

For example, the substrate layer 102 can be secured to the mounting surface 116 using board standoffs such as board standoffs 118 and 120. The substrate layer 102 can be secured to mounting surface 116 in such a fashion as to keep support layer 114 in a constant state of compression. Therefore, support layer 114 can provide a constant mechanical force or pressure that pushes conductive layer 110 towards the non-conductive layer 108 and, by association, substrate layer 102.

As an example, the support layer 114 can be a foam layer. For example, the foam layer can be a soft foam tape.

A power source 122 can provide power to the one or more components mounted to substrate layer 102, including, for example, component 104. As an example, power source 122 can be an alternating current power source providing power at about 120 or about 240 volts.

According to an aspect of the present disclosure, the flow of power from power source 122 to the components of the printed circuit board assembly 100 can be regulated or otherwise controlled by a fault interruption circuit 124. The fault interruption circuit 124 can be an internal component of the appliance or can be included in a branch circuit that is external to the appliance.

In particular, fault interruption circuit 124 can include a current leakage detector that measures a difference between incoming and outgoing current for the device as a whole. Alternatively, the current leakage detector can measure a difference between incoming and outgoing current solely for the printed circuit board assembly 100, rather than the device as a whole.

When fault interruption circuit 124 detects a significant imbalance in incoming and outgoing current, then the circuit 124 can interrupt the flow of power from power source 122 to the printed circuit board assembly 100. For example, the fault interruption circuit 124 can open a relay that provides electrical connection between the power source 122 and the printed circuit board assembly 100, thereby interrupting the flow of power. However, other methods or components for interrupting the flow of power can be used, as well. Thus, if one or more components of printed circuit board assembly 100, such as component 104, become grounded, then fault interruption circuit 124 can interrupt the flow of power to printed circuit board assembly 100.

According to another aspect of the present disclosure, non-conductive layer 108 can decompose when the temperature at the non-conductive layer 108 reaches elevated levels associated with a fault condition. As an example, elevated temperatures associated with a fault condition occurring at component 104 and solder pin 106 can reduce the structural integrity of the non-conductive layer 108 such that non-conductive layer 108 melts or otherwise degrades to open a hole in non-conductive layer 108. As another example, the structural integrity of non-conductive layer 108 can be reduced such that solder pin 106 is allowed to pierce or otherwise protrude through non-conductive layer 108.

Figure 2:
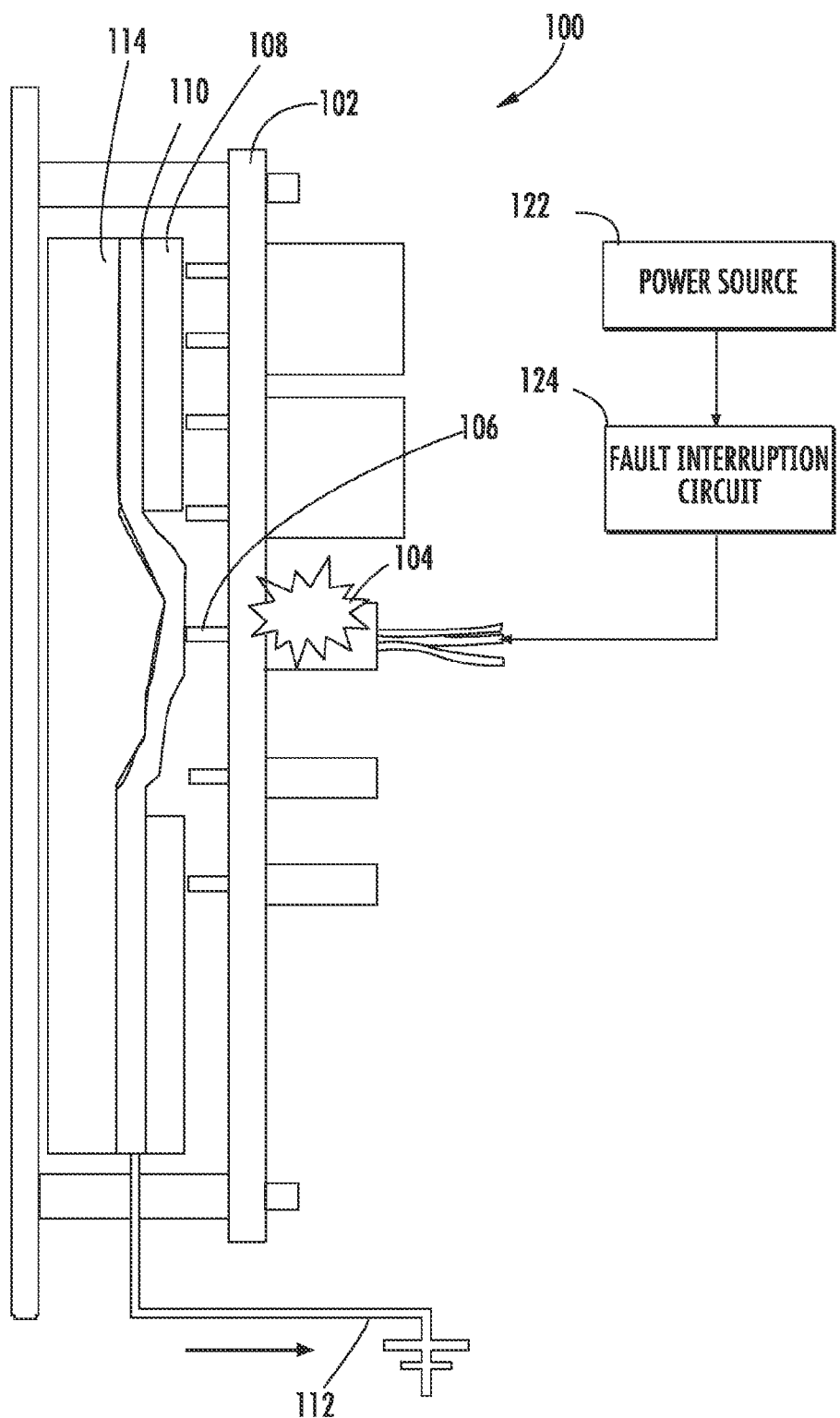
FIG. 2 depicts a simplified diagram of an example printed circuit board assembly according to an example embodiment of the present disclosure.

As an example, FIG. 2 depicts a simplified diagram of example printed circuit board assembly 100 according to an example embodiment of the present disclosure. In particular, FIG. 2 depicts the printed circuit board assembly 100 after a fault event has occurred at component 104.

More particularly, a fault event occurring at component 104 can cause the temperatures at component 104 and solder pin 106 to reach elevated levels. The elevated temperature levels can cause the portion of non-conductive layer 108 that is adjacent to solder pin 106 to decompose or otherwise degrade, thereby providing an opening. Alternatively or additionally, the elevated temperature levels can cause degradation of the non-conductive layer 108 such that solder pin 106 can pierce non-conductive layer 108.

Due to the opening in non-conductive layer 108, the conductive layer 110 can come into electrical contact with solder pin 106. For example, the pressure provided by support layer 114 can secure the electrical connection between conductive layer 110 and solder pin 106.

Therefore, component 104 can be connected to ground 112 via solder pin 106 and conductive layer 110. Furthermore, the grounding of component 104 can result in a current imbalance that triggers fault interruption circuit 124 to interrupt the flow of power from power source 122 to the printed circuit board assembly 100 and component 104.

In such fashion, printed circuit board assembly 100 can assist in quickly identifying and resolving a fault condition at an associated electronic component. In particular, the thermal conditions resulting from a fault condition can cause the decomposition of the non-conductive layer 108. The decomposition of non-conductive layer 108 along with the force provided by support layer 114 can secure electrical connection between the solder pin 106 and the conductive layer 110, thereby grounding the components experiencing the fault and triggering the fault interruption circuit 124. Interruption of the power flow by fault interruption circuit 124 can mitigate damage to printed circuit board assembly 100 and prevent the occurrence of a fire.

It will be appreciated that printed circuit board assembly 100 is provided as an example and does not limit the present disclosure to the particular structures and arrangement shown. In particular, in some embodiments of the present disclosure, the layers of assembly 100 can be integral to or otherwise embedded within the substrate layer 102. For example, the conductive layer 110 can include a single ground plane or ground traces that encircle certain components or circuits. The ground plane or traces can be isolated from all circuits on the board. In the event of a fault condition, arc tracking and decomposition of the substrate 102 can allow current to jump from the circuitry to the ground plane or traces. This current can be detected by fault interruption circuit 124, which would thereafter terminate power.

In other embodiments of the present disclosure, fault interruption circuit 124 can include multiple current leakage detection and power control circuits that are respectively associated with various components, such that detection of a current imbalance and the interruption of the flow of power can be specific to a particular component.

Figure 3:
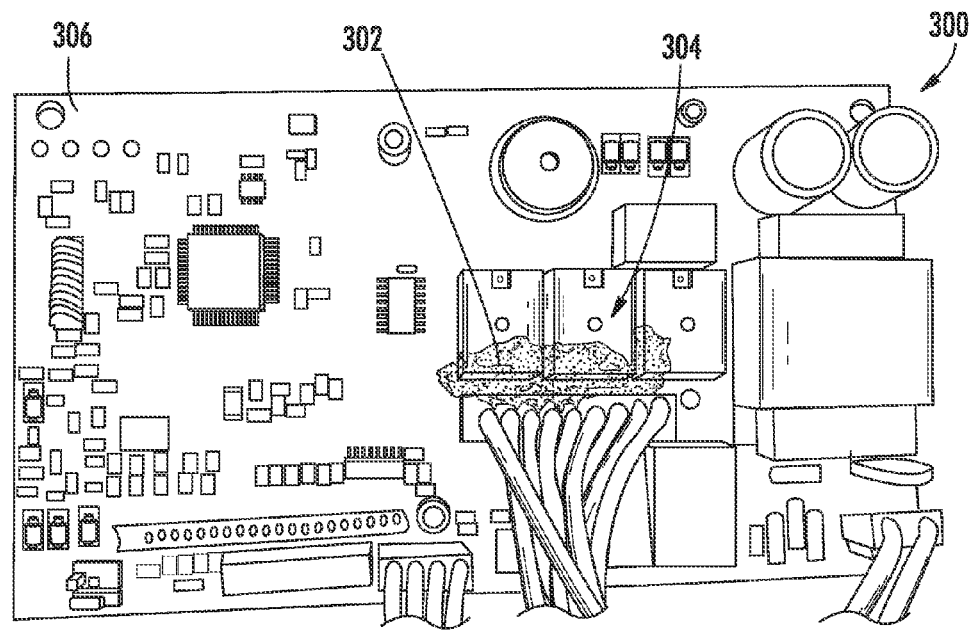
FIG. 3 depicts a front side of an example printed circuit board assembly according to an example embodiment of the present disclosure.

FIG. 3 depicts a front side of an example printed circuit board assembly 300 according to an example embodiment of the present disclosure. In particular, the printed circuit board assembly 300 depicted in FIG. 3 has been subjected to a forced failure test conducted at a connector 302 associated with components 304 mounted to a front surface of a substrate layer 306 of printed circuit board assembly 300.

Figure 4:
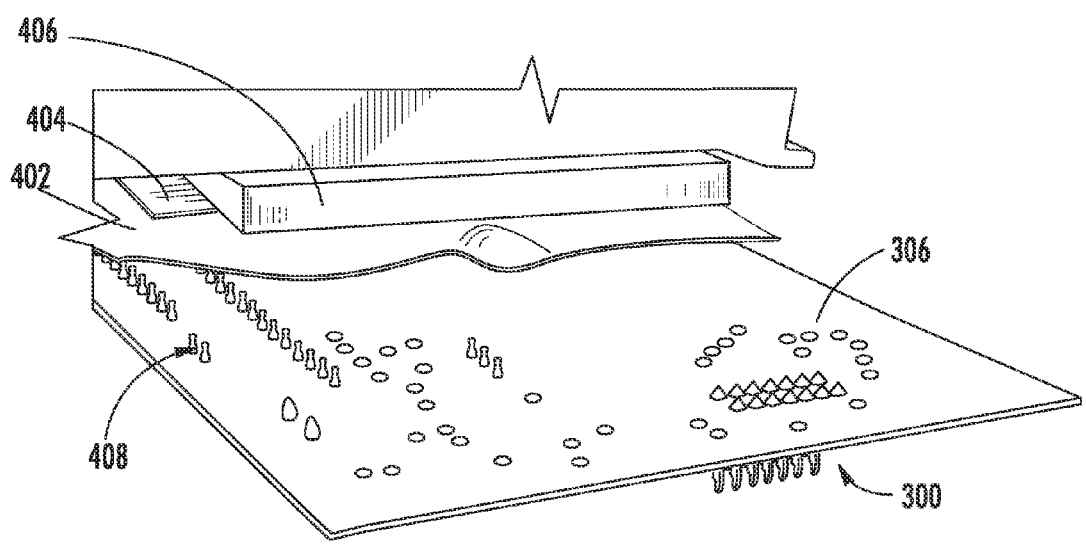
FIG. 4 depicts a cut-away cross-sectional view of an example printed circuit board assembly according to an example embodiment of the present disclosure.

FIG. 4 depicts a cut-away cross-sectional view of printed circuit board assembly 300 according to an example embodiment of the present disclosure. In particular, shown in FIG. 4 is a rear surface of substrate layer 306. Also shown in FIG. 4 is a non-conductive layer 402 adjacent to the rear surface of substrate layer 306, a conductive layer 404 adjacent to non-conductive layer 402, and a support layer 406 adjacent to conductive layer 404. A plurality of solder pins (e.g. solder pins 408) can also be seen extending from the rear surface of substrate layer 306.

Figure 5:
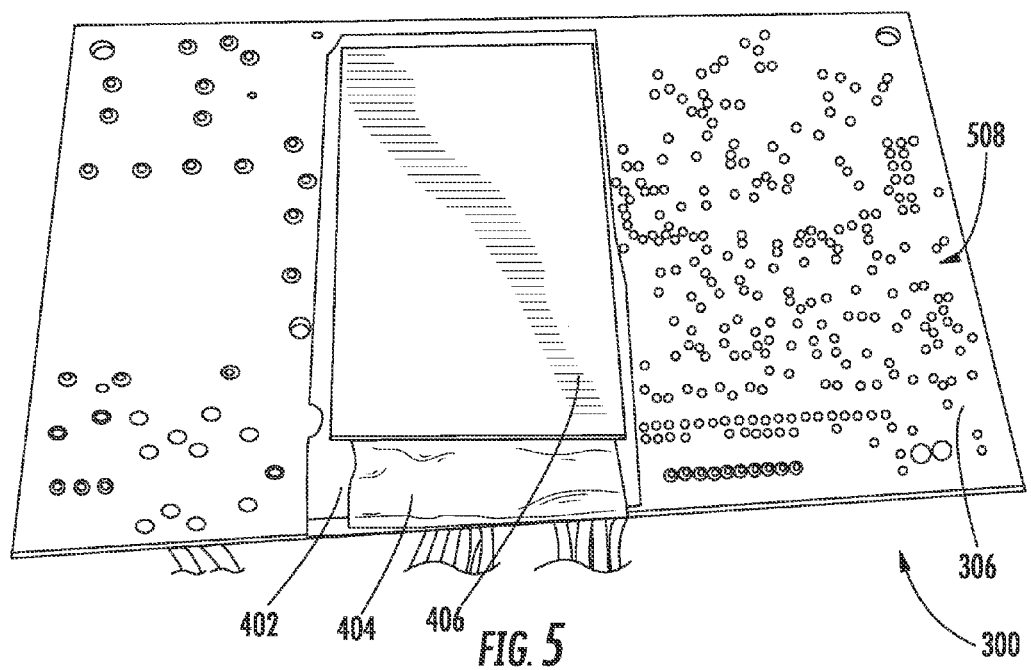
FIG. 5 depicts a rear side of an example printed circuit board assembly according to an example embodiment of the present disclosure.

FIG. 5 depicts a rear side of example printed circuit board assembly 300 according to an example embodiment of the present disclosure. In particular, shown in FIG. 5 is the rear surface of substrate layer 306. Also shown in FIG. 5 is the non-conductive layer 402 adjacent to the rear surface of substrate layer 306, the conductive layer 404 adjacent to non-conductive layer 402, and the support layer 406 adjacent to conductive layer 404. A plurality of solder pins (e.g. solder pins 508) can also be seen extending from the rear surface of substrate layer 306.

Figure 6:
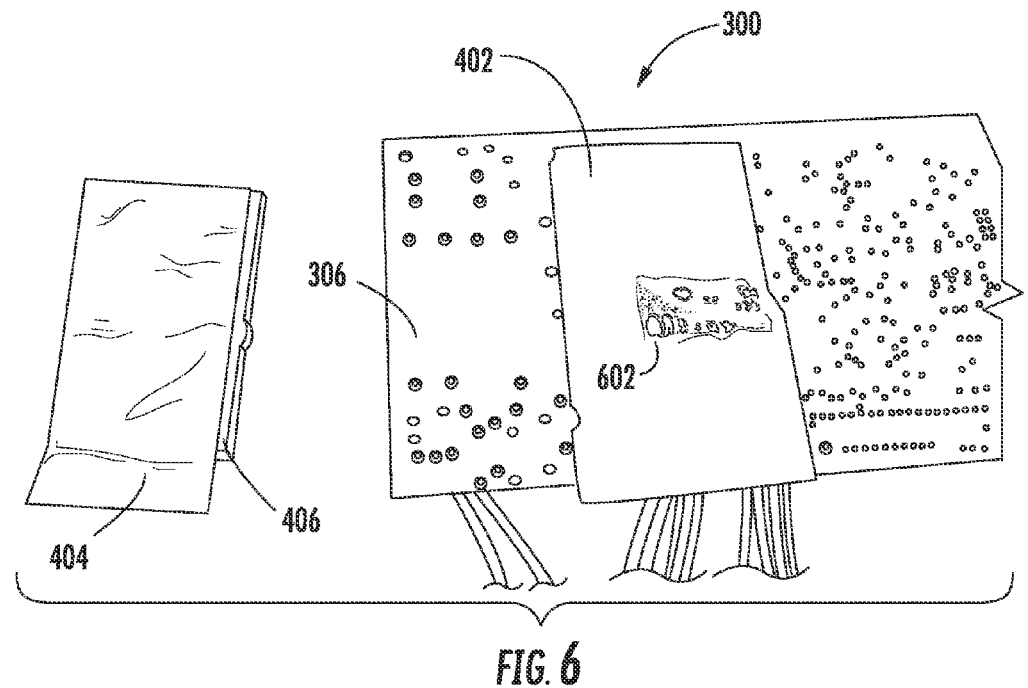
FIG. 6 depicts a disassembled view of an example printed circuit board assembly according to an example embodiment of the present disclosure.

FIG. 6 depicts a disassembled view of example printed circuit board assembly 300 according to an example embodiment of the present disclosure. In particular, example printed circuit board assembly 300 has been disassembled by removal of the support layer 406 and the conductive layer 404, which are respectively shown on the left side of FIG. 6.

More particularly, as shown in FIG. 6, the forced failure test has caused thermal conditions sufficient to cause degradation of the non-conductive layer 402. In particular, due to the elevated temperatures resulting from the forced failure test, non-conductive layer 402 has degraded to create several openings, including, for example, opening 602.

As a result of the openings in non-conductive layer 402, conductive layer 404 was able to electrically connect with one or more solder pins protruding from the rear surface of substrate layer 306, thereby grounding the components that were subjected to the forced failure test. Due to such grounding, a fault interruption circuit interrupted the flow of power to the printed circuit board assembly 300.

Figure 7:
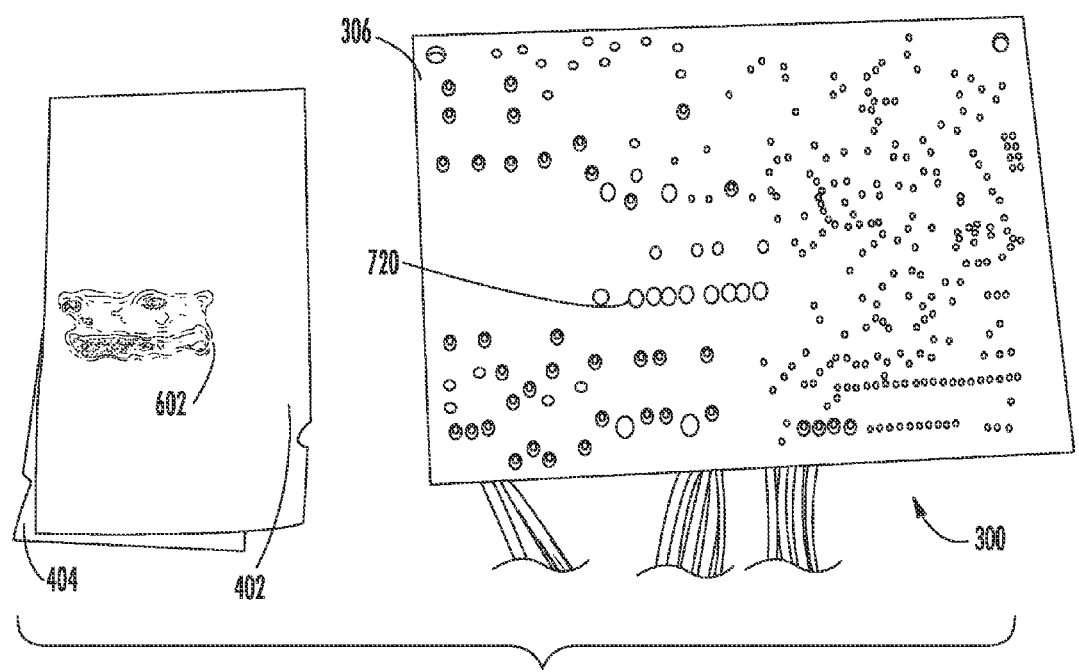
FIG. 7 depicts a disassembled view of an example printed circuit board assembly according to an example embodiment of the present disclosure.

FIG. 7 depicts a disassembled view of example printed circuit board assembly 300 according to an example embodiment of the present disclosure. In particular, example printed circuit board assembly 300 has been disassembled by removal of the conductive layer 404 and the non-conductive layer 402, which are respectively shown on the left side of FIG. 7.

More particularly, as shown in FIG. 7, damage to the rear surface of substrate layer 306 was successfully mitigated through the use of the aspects of the present disclosure. In particular, electrical connection between one or more solder pins 702 and conductive layer 404 through opening 602 allowed the components experiencing the fault conditions to be grounded, thereby triggering a fault interruption circuit, mitigating damage to printed circuit board assembly 300, and preventing the spread of flame within the appliance.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A printed circuit board assembly comprising:
   a substrate layer, wherein one or more solder pins are located on a rear surface of the substrate layer;

a non-conductive layer adjacent to the rear surface of the substrate layer;
a conductive layer adjacent to the non-conductive layer, wherein the conductive layer is electrically connected to a ground;
a mounting surface; and
a support layer compressed between the conductive layer and the mounting surface, wherein the support layer applies a mechanical force that presses the conductive layer towards the non-conductive layer.

2. The printed circuit board assembly of claim 1, wherein:
the one or more solder pins are associated with one or more components mounted on a front surface of the substrate layer; and
the non-conductive layer comprises a non-conductive material that decomposes at temperatures associated with a fault condition at the one or more components mounted to the front surface of the substrate layer.

3. The printed circuit board assembly of claim 2, wherein decomposition of the non-conductive layer allows electrical connection between the conductive layer and the one or more solder pins, thereby grounding the one or more components.

4. The printed circuit board assembly of claim 3, wherein the mechanical force applied by the support layer assists in securing the electrical connection between the conductive layer and the one or more solder pins.

5. The printed circuit board assembly of claim 3, wherein a fault interruption circuit removes the application of power to the one or more components when the one or more components are grounded.

6. The printed circuit board assembly of claim 2, wherein decomposition of the non-conductive layers allows the solder pins to pierce through the non-conductive layer.

7. The printed circuit board assembly of claim 1, wherein the non-conductive layer comprises a plastic sheet.

8. The printed circuit board assembly of claim 1, wherein the conductive layer comprises a metallic film.

9. The printed circuit board assembly of claim 1, wherein the support layer comprises a foam layer compressed between the conductive layer and the mounting surface.

10. The printed circuit board assembly of claim 1, wherein the non-conductive layer comprises a dielectric material.

11. The printed circuit board assembly of claim 1, wherein the non-conductive layer comprises a material that increases in conductivity when heated to temperatures associated with fault conditions at one or more components mounted to a front surface of the substrate layer.

12. The printed circuit board assembly of claim 11, wherein the non-conductive layer increases in conductivity by becoming carbonized.

13. The printed circuit board assembly of claim 1, wherein the printed circuit board assembly is located within an appliance.

14. A printed circuit board assembly comprising:
a substrate layer supporting one or more components on a first surface and having one or more solder pins on a second surface, the one or more solder pins being associated with the one or more components;
a non-conductive layer adjacent to the second surface of the substrate layer;
a conductive layer adjacent to the non-conductive layer and connected to a ground;
a foam layer adjacent to the conductive layer; and
a mounting surface, wherein the foam layer is compressed between the mounting surface and the conductive layer so as to apply pressure to the conductive layer that influences the conductive layer towards the second surface of the substrate layer;
wherein the non-conductive layer decomposes at elevated temperatures associated with a high resistance connection, a failure of the one or more components, or an arc tracking event; and
wherein decomposition of the non-conductive layer allows electrical connection between the one or more solder pins and the conductive layer, thereby grounding the one or more components.

15. The printed circuit board assembly of claim 14, wherein:
the non-conductive layer comprises a plastic sheet; and
the conductive layer comprises a metallic film.

16. The printed circuit board assembly of claim 14, wherein decomposition of the non-conductive layer reduces the structural integrity of the non-conductive layer such that the pressure applied by the foam layer causes the one or more solder pins to pierce the non-conductive layer.

17. A printed circuit board comprising:
a substrate, the substrate having one or more conductive components embedded therein;
a non-conductive layer adjacent to the conductive components embedded in the substrate;
a conductive layer adjacent to the non-conductive layer, at least a portion of the conductive layer being conductive of electrical energy; and
a foam support layer adjacent to the conductive layer;
wherein the foam support layer is compressed so as to provide pressure forcing the conductive layer towards the non-conductive layer; and
wherein at least a portion of the non-conductive layer is formed from a material that decomposes at temperatures associated with a fault condition.

18. The printed circuit board of claim 17, wherein decomposition of the portion of the non-conductive layer allows electrical connection between the conductive components on the rear surface of the printed circuit board and the portion of the conductive layer being conductive of electrical energy.

19. The printed circuit board of claim 18, wherein the pressure provided by the foam support layer secures the electrical connection between the conductive components on the rear surface of the printed circuit board and the portion of the conductive layer being conductive of electrical energy.

20. The printed circuit board of claim 17, wherein:
the conductive layer comprises one or more ground planes or one or more ground traces; and
the conductive layer is integral to the substrate.

* * * * *